(12) United States Patent
Chang et al.

(10) Patent No.: US 6,927,715 B2
(45) Date of Patent: Aug. 9, 2005

(54) DEVICE AND CONTROL STRUCTURE OF MULTI-LEVEL PULSE WIDTH MODULATION

(75) Inventors: Sheng-Tsai Chang, Changhua Hsien (TW); Ming-Che Yang, Kaohsiung (TW); You-Jan Lin, Hsinchu (TW); Kun-Ying Lo, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 590 days.

(21) Appl. No.: 09/750,819

(22) Filed: Dec. 28, 2000

(65) Prior Publication Data

US 2002/0041246 A1 Apr. 11, 2002

(30) Foreign Application Priority Data

Oct. 9, 2000 (TW) ....................................... 89121079 A (51) Int. Cl.$^7$ ............................................... H03M 3/00
(52) U.S. Cl. ......................................................... 341/143
(58) Field of Search ................................. 341/143, 152, 341/144; 375/242, 238

(56) References Cited

U.S. PATENT DOCUMENTS

| | | | | |
|---|---|---|---|---|
| 4,384,274 A | * | 5/1983 | Mao | ........................... 341/135 |
| 5,796,359 A | * | 8/1998 | Beard | ........................... 341/143 |
| 6,014,055 A | * | 1/2000 | Chester | ........................ 330/10 |
| 6,606,046 B2 | * | 8/2003 | Kanno | ........................... 341/144 |

* cited by examiner

Primary Examiner—Peguy JeanPierre
(74) Attorney, Agent, or Firm—J.C. Patents (57) ABSTRACT

A multi-level pulse width modulation (MPWM) digital-to-analog converter for receiving a n-bit pulse code modulation (PCM) signal and then outputting a m-level analog signal is provided. The MPWM DAC comprises a converter circuit, $2^m$ first output drivers, $2^m$ second output drivers and a control circuit. The converter circuit is used for converting (n-m) most significant bits (MSB) of the n-bit PWM signal into a PWM waveform, and then generating a first input signal and a second input signal. Each of the $2^m$ first output drivers is used for receiving the first input signal, and then generating a first output current, wherein the first output currents of the $2^m$ first output drivers can be equal or not. Each of the $2^m$ second output drivers is used for receiving the second input signal, and then generating a second output current, wherein the second output currents of the $2^m$ first output drivers can be equal or not. The control circuit is coupled to the converter circuit, $2^m$ first output drivers, and $2^m$ second output drivers, for controlling the on-off status of each of the first and the second output drivers.

15 Claims, 6 Drawing Sheets

DEVICE AND CONTROL STRUCTURE OF MULTI-LEVEL PULSE WIDTH MODULATION

CROSS-REFERENCE TO RELATED APPLICATION

This application claims the priority benefit of Taiwan application Serial No. 89121079, filed Oct. 9, 2000.

BACKGROUND OF THE INVENTION

1. Field of Invention

The present invention relates to a digital-to-analog converter (DAC). More particularly, the present invention relates to a digital-to-analog converter of multi-level pulse width modulation.

2. Description of Related Art

Pulse width modulation (PWM) is a representation by converting pulse code modulation (PCM) using different duty cycles. By transforming the PCM into the PWM, the PWM can directly drive speakers for generating analog signals for output, which becomes a PWM DAC. The resolution, sampling rat, and input clock frequency of the PWM DAC have the following relationships:

a. resolution×sampling rate=input clock frequency, for one-end PWM DAC
b. resolution×sampling rate=2×input clock frequency, for one-end PWM DAC Accordingly, as the input clock frequency is fixed, the resolution is inversely proportion to the sampling rate. Namely, it has to lower the sampling rate if a high resolution of the PWM DAC is required. In contrast, it has to reduce the resolution of the PWM DAC if a high sampling rate is required.

Figure 1:
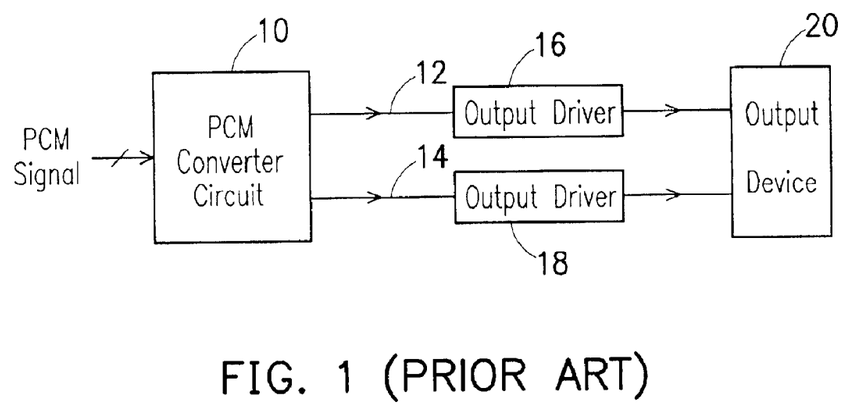
FIG. 1 shows a conventional PWM DAC block diagram.

FIG. 1 shows a conventional PWM DAC block diagram. As soon as the PCM DAC receives a PCM signal, signals P+ 12 and P− 14 are outputted to output buffers 16, 18 and then the output buffers 16, 18 output driving signals to an output device 20 such that the output signals of the output device 20 are PWM signals.

Figure 2:
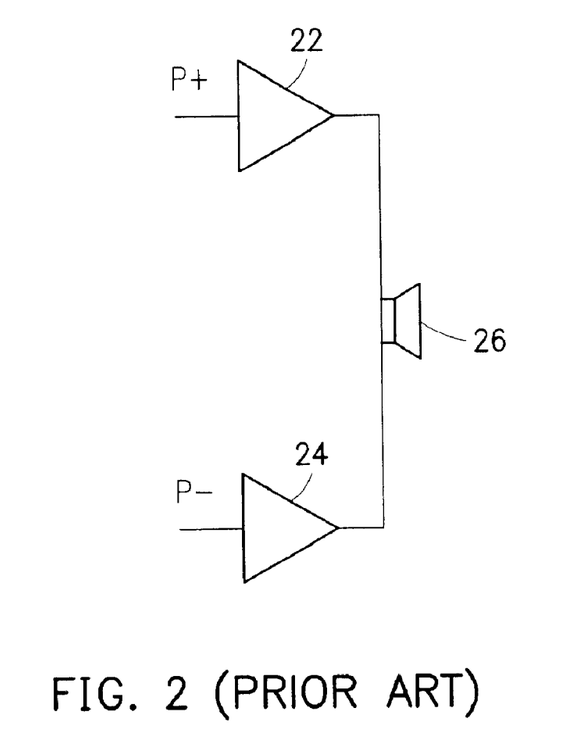
FIG. 2 shows a conventional PWM DAC circuit.

Referring to FIG. 2, the conventional PWM DAC comprises a first output driver 22 and a second output driver 24. The input of the first output driver 22 receives an input signal P+, and the output of the first output driver 22 is connected to an input of a speaker 26. The input of the second output driver 24 receives an input signal P−, and the output of the second output driver 24 is connected to another input of a speaker 26. The speaker 26 can output a sound signal to external in response to the two input signals P+ and P−. For example, the PWM DAC can receive n-bit PCM signal, and output an m-level analog signals. In addition, the input signals P+ and P− are used for converting (n−m) most significant bits (MSBs) of the n-bit PWM signal into a PWM waveform, wherein n and m are integers, and n>m.

Referring to FIG. 1, the output PWM waveforms of the first and the second output drivers 22, 24 contains only two logic levels of "0" and "1". Because the smallest unit is 1 for the digital output of the PWM, only integers like X, X+1, and X+2 (X is an integer), etc can be represented according to the conventional method. However, if the PCM values need to be represented by fractional values like X, X+¼, X+²⁄₄, and X+¾, etc, the conventional PWM DAC fails to achieve this purpose.

SUMMARY OF THE INVENTION

As embodied and broadly described herein, the invention provides multi-level pulse width modulation (MPWM) digital-to-analog converter (DAC) for receiving a pulse code modulation (PCM) signal having n bits and then outputting a pulse width modulation (PWM) signal. The MPWM DAC comprises a converter circuit, a control device, a first output driver device, a second output driver device and an output device.

The converter circuit converts (n−m) bits of the PCM signal into the PWM signal, wherein m is the number of the least significant bit (LSB) signal of the PCM signal and n>m. Each of the first output driver device and the second output driver has different number of output drivers, thereby the output PWM signal is a multi-level signal, rather that a two-level signal in the prior art.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

As the description of the related art, the output waveform of the conventional PWM only contains two logic levels, "0" and "1". According to the present invention, the output waveform of the PWM is changed to an analog-like output waveform, named multi-level PWM (NTWM). Accordingly, the resolution increases and the sampling rate can be remained. A four level MPWM is used as an example for discussing the operation of the MPWM according to the preferred embodiment of the present invention.

Figure 3:
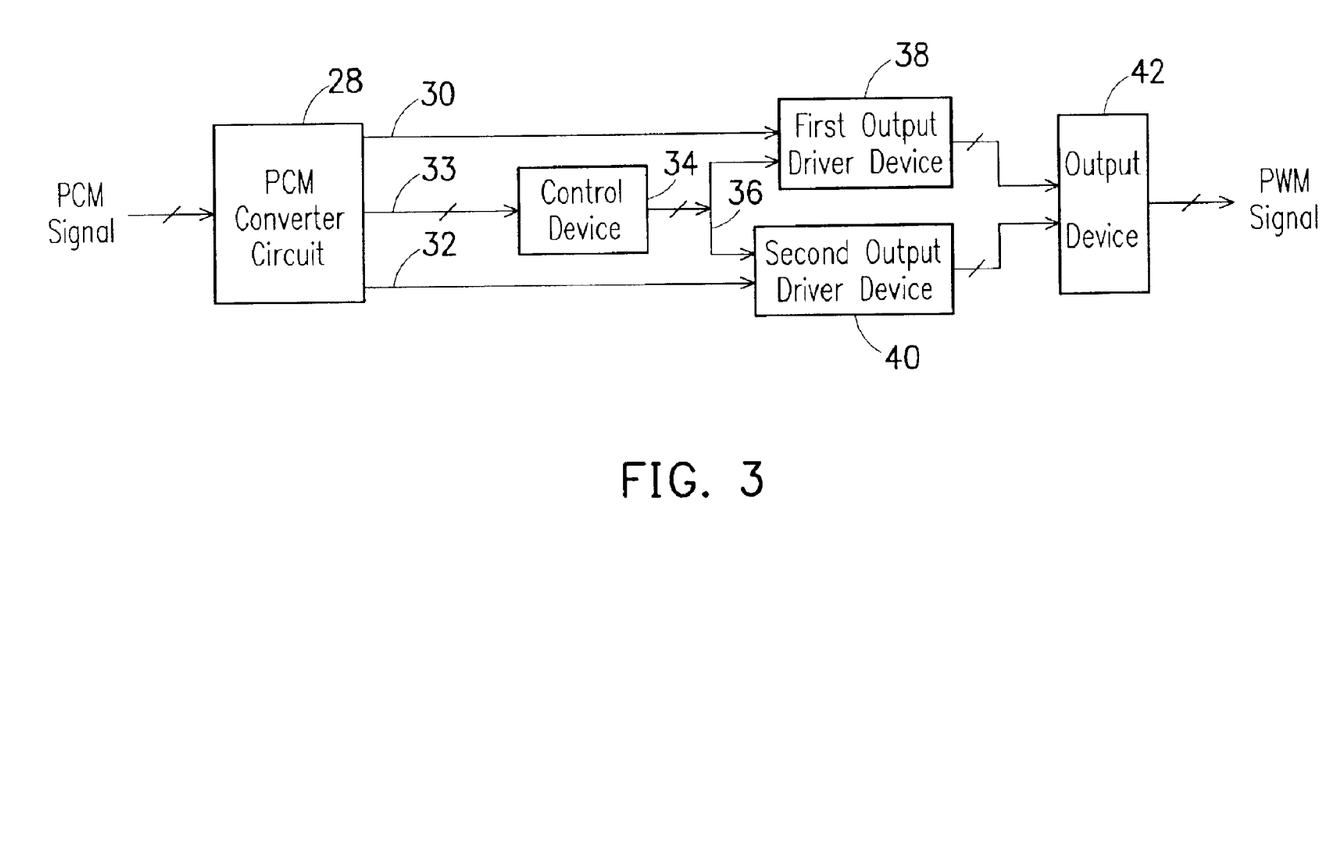
FIG. 3 schematically shows a multi-level pulse width modulation (MPWM) DAC circuit according to one preferred embodiment of this invention.

Referring to FIG. 3, it schematically shows a MPWM DAC block diagram according to one preferred embodiment of the present invention. While a PCM converter circuit receives a PCM signal, an input signal MP+ 30, an input signal MP− 32 and an enabling signal 33 are respectively outputted to a first driver device 38, a second driver device 40 and a control device 34. As the control device receives the enabling signal 33, a control signal 36 is outputted to the first and the second output driver devices 38, 40. As the input signals MP+ 30, MP− 32 and the control signal 36 are respectively received by the first and the second output driver devices 38, 40 and the control device 34, then output driving signals from the first and the second output driver device 38, 40 are sent to an output device for generating a PWM signal.

Figure 4:
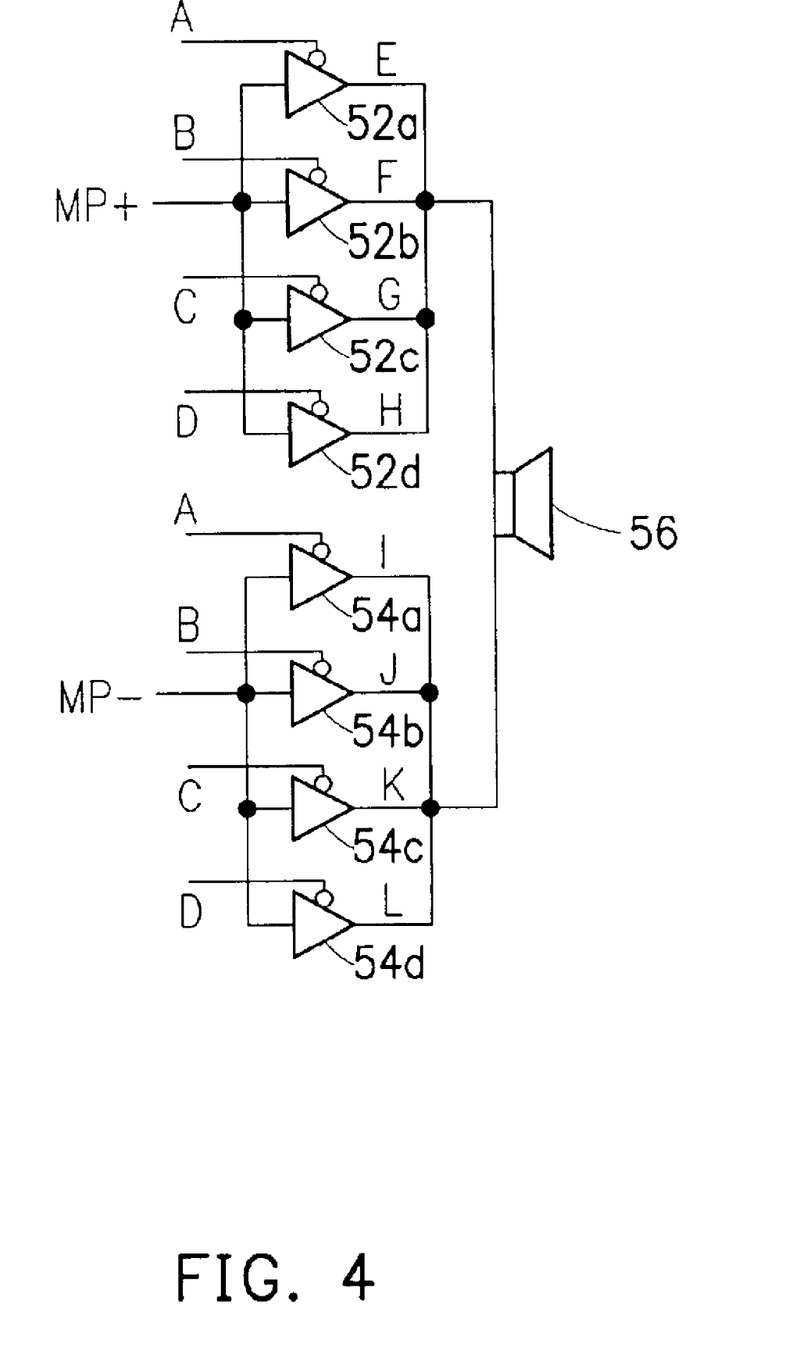
FIG. 4 shows output waveforms of the MPWM DAC according to the present invention.

FIG. 4 schematically shows a multi-level pulse width modulation (MPWM) DAC block diagram according to one preferred embodiment of this invention.

According to the present invention, the output drivers 22, 24 of the conventional PWM DAC shown in FIG. 2 is respectively divided into four output drivers 52a~52d and 54a~54d. The sum of the maximum output currents of each of the output drivers 22a~22d or 24a~24d is equal to the sum of the output currents of output drivers 22 or 24 of the conventional PWM DAC. It should be noted that the maximum output current is not used to limit the scope of the present invention. Therefore, the output driving capacity for each output drivers 52a~52d or 54a~54d has not to be equal. Namely, the out driving capacity of each output drivers 52a~52d, 54a~54d is designed on demand. In addition, the output drivers 52a~52d or 54a~54d can be general drivers, tri-state buffers, but other buffers having the same function can also be used. Tri-state buffers are used as an example for following description.

Each of the output drivers 52a~52d has an input for receiving an input signal MP+ and outputs E, F, G, H respectively for connecting to an input of a speaker 56. Each of output drivers 52a~52d further has a control pin for receiving control signals A, B, C, and D respectively for controlling the on/off state of each of output drivers 52a~52d. The control signals A, B, C and D are generated by a control device 34 shown in FIG. 3. Similarly, each of the output drivers 54a~54d has an input for receiving an input signal MP− and outputs I, J, K, L respectively for connecting to another or the same input of a speaker 56. Each of output drivers 54a~54d further has a control pin for receiving the control signals A, B, C, and D respectively for controlling the on/off state of each of output drivers 54a~54d. The control signals A, B, C and D are also generated by the control device 34 shown in FIG. 3. The input signals MP+ and MP− are generated by m-level concerter to convert (n-m) most significant bits (MSBs) of the PCM signal into a PWM waveform, in which n and m are positive integers and n>m.

Although, the maximum output current of each of the output drivers 52a~52d or 54a~54d of the MPWM DAC, for example, is one-fourth of that of the conventional PWM DAC 10, but the four output drivers 22a~22d or 24a~24d operate in the same manner and therefore, the effect is the same as the conventional PWM DAC.

However, if it is further desired to represent fractional PCM values like X+(Q/P), the conventional PWM DAC fails the fractional representation, in which P represents a sum of the maximum output currents of the output drivers 52a~52d and 54a~54d, while Q represents a sum of the output currents of the enabled tri-state buffers. The conventional PWM DAC can only represent PCM values in integer, such as X, X+1, and X+2 etc., because the output of the conventional PWM DAC is digital and with a minimum output unit "1". In contrast, according to the present invention, the output current of each the output driver is a fraction of the output current of the output driver of the conventional PWM DAC, and therefore, the minimum output unit of the MPWM DAC of the present invention is a fractional Q/P, such as ¼. Accordingly, the PCM values can be easily represented in X+(Q/P), such as X+(¼), X+(²⁄₄) and X+(¾), etc.

Figure 7:
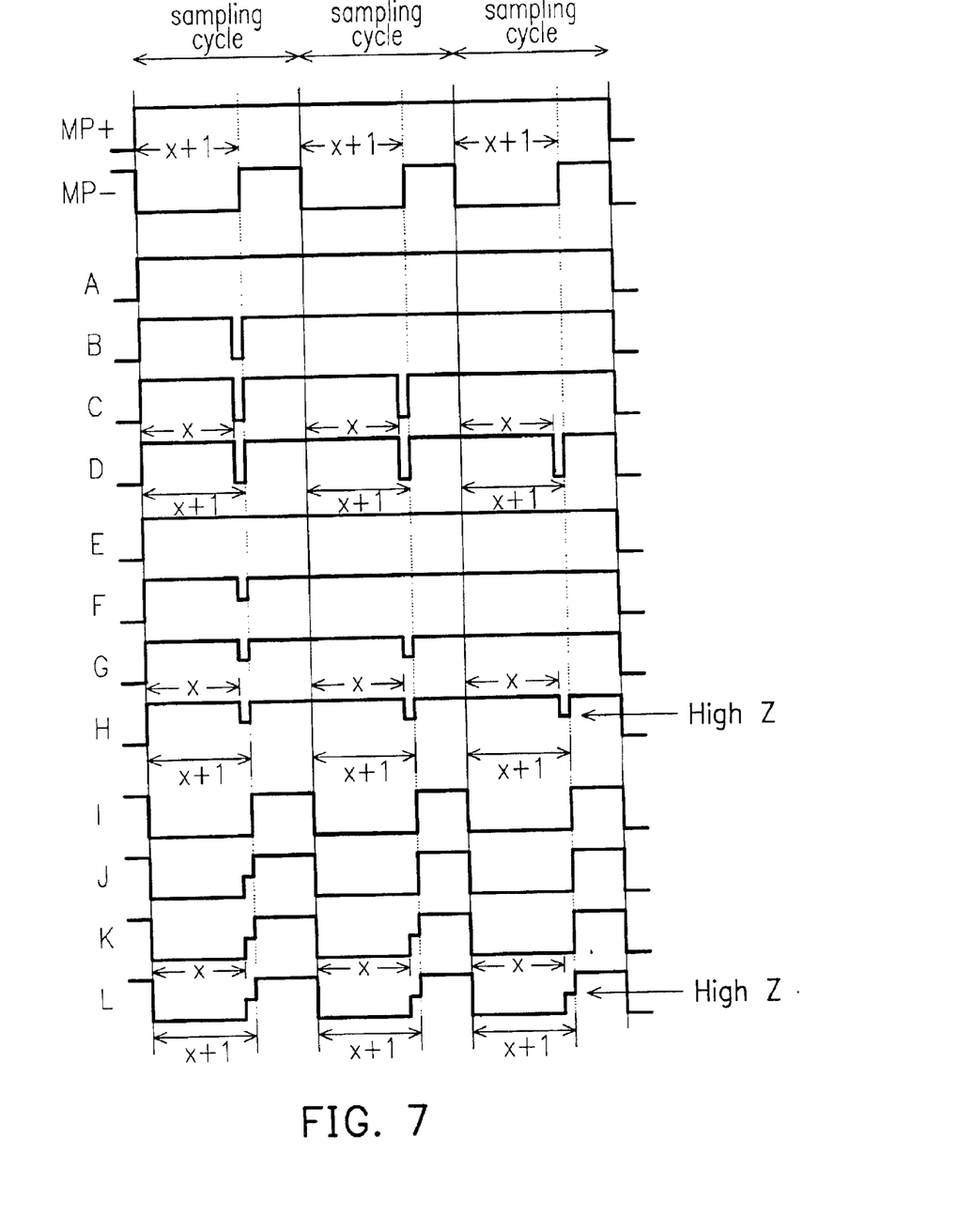
FIG. 7 shows output waveforms according to the MPWM DAC of the present invention.

Referring to FIGS. 4 and 7, FIG. 7 shows output waveforms of the MPWM DAC according to the present invention. Referring to FIGS. 2 and 4, for each the sampling cycle and between time X and X+1, if the output driver is kept in a low-level state the output value for the output driver is added by the maximum current; and if the output driver is not kept in a low-level state, the output driver becomes a high impedance state. After time X+1 and before the end of the sampling cycle, each of the output drivers in a high-level state.

For example, in the beginning of the first sampling cycle, the input signals MP+ and MP− of the output drivers 52a~52d and the output drivers 54a~54d are in a high-level state and a low-level state respectively. The input signal MP− remains in the low-level state until the time X+1, and becomes a high-level state after time X+1. In addition, the control signals A, B, C and D are all in the high-level state, and the outputs E, F, G and H of the output drivers 52a~52d are in the high-level state and the outputs I, J, K and L of the output drivers 54a~54d are in the low-level state.

After a time interval X passes, the control signals B, C and D are transient from the high-level state to the low-level state, by which the outputs F, G and H of the output drivers are transient from the high-level state to a lower-level state that is lower than the high level by a predetermined value, and the outputs J, K and L of the output drivers are transient from the low-level state to a higher-level state that is higher than the low level by the same predetermined value. After time X+1, the control signals B, C, and D return to the high-level state, by which the outputs F, G, and H return to the high-level state, and the outputs J, K, and L return to the high-level state. The outputs I, J, K and L remain in the high-level state until the end of the first sampling cycle.

In the second sampling cycle, the waveforms of the input signals MP+ and MP− for the output drivers 52a~52d and 54a~54d are the same as those in the first sampling cycle. Within the time interval X in the second sampling cycle, the control signals A, B, C and D are in the high-level state, and the outputs B, F, G and H of the output drivers 52a~52d are in the high-level state and the outputs I, F, K and L of the output drivers 54a~54d are in the low-level state.

After a time interval X passes, the control signals C and D are transient from the high-level state to the low-level state, by which the outputs G and H of the output drivers are transient from the high-level state to a lower-level state that is lower than the high level by the same predetermined value above, and the outputs K and L of the output drivers are transient from the low-level state to a higher-level state that is higher than the low level by the same predetermined value. After time X+1, the control signals C, and D return to the high-level state, by which the outputs G, and H return to the high-level state, and the outputs K and L return to the high-level state. The outputs I, J, K and L remain in the high-level state until the end of the second sampling cycle, and then become the low-level state.

In the third sampling cycle, the waveforms of the input signals MP+ and MP− for the output drivers 52a~52d and 54a~54d are the same as those in the first sampling cycle. Within the time interval X in the second sampling cycle, the control signals A, B, C and D are in the high-level state, and the outputs E, F, G and H of the output drivers 52a~52d are in the high-level state and the outputs I, J, K and L of the output drivers 54a~54d are in the low-level state.

After a time interval X passes, the control signal D is transient from the high-level state to the low-level state, by which the output H of the output driver is transient from the high-level state to a lower-level state that is lower than the high level by the same predetermined value above, and the output L of the output driver is transient from the low-level state to a higher-level state that is higher than the low level by the same predetermined value. After time X+1, the control signal D returns to the high-level state, by which the output H returns to the high-level state, and the output L returns to the high-level state. The outputs I, J, K and L remain in the high-level state until the end of the third sampling cycle, and then become the low-level state.

Then, the waveforms return to the waveforms shown in the first sampling cycle, and the operation is performed sequentially.

The output of the MPWM DAC to the speaker can vary according to the output currents of the output drivers 52a~52d and the output drivers 54a~54d. For example, if the output currents of the output drivers 52a~52d and the output drivers 54a~54d are ⅛, ⅛, ¼ and ½ of the MP+ and MP− respectively, and the output drivers 52a~52d and the output drivers 54a~54d are controlled by the control device 34 shown in the FIG. 3 for selecting the outputs thereof, by which the output of the speaker 56 is controlled.

Figure 5:
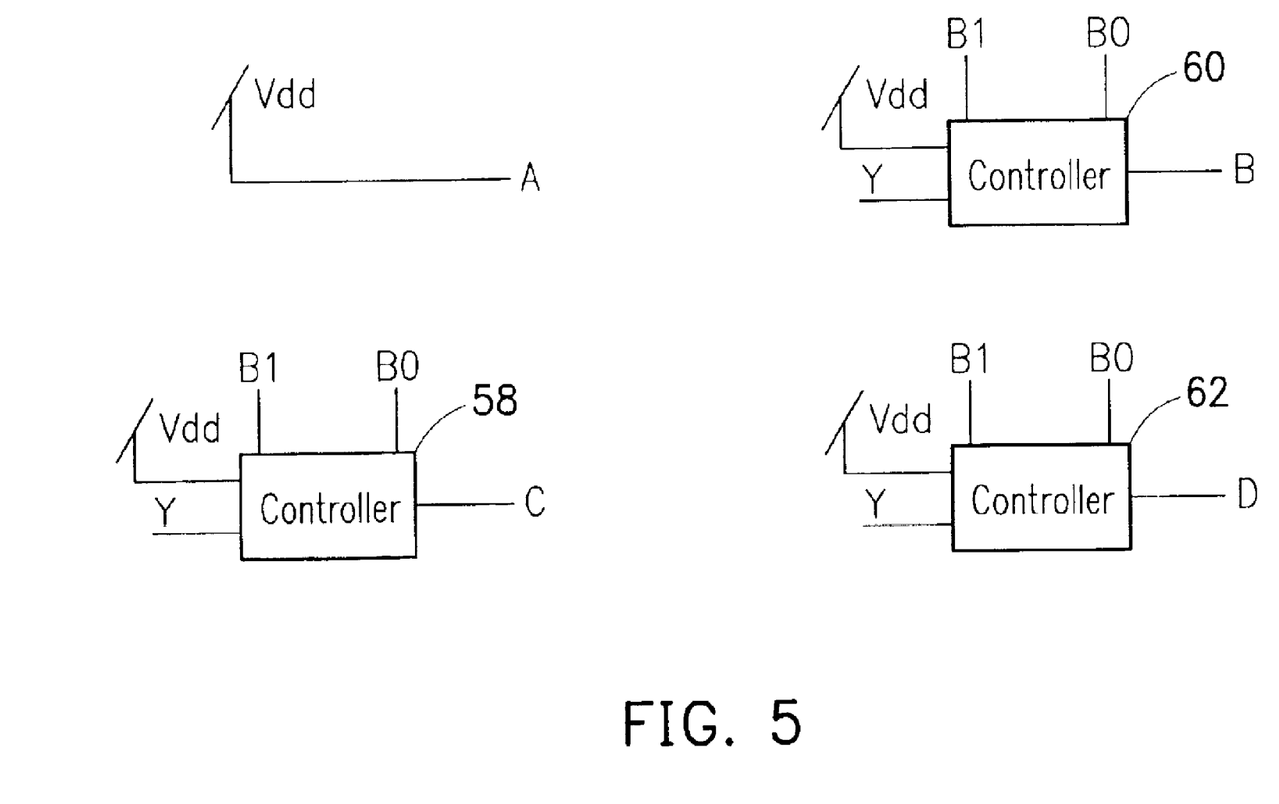
FIG. 5 shows exemplary control circuits for the MPWM DAC according to the present invention.
Figure 6:
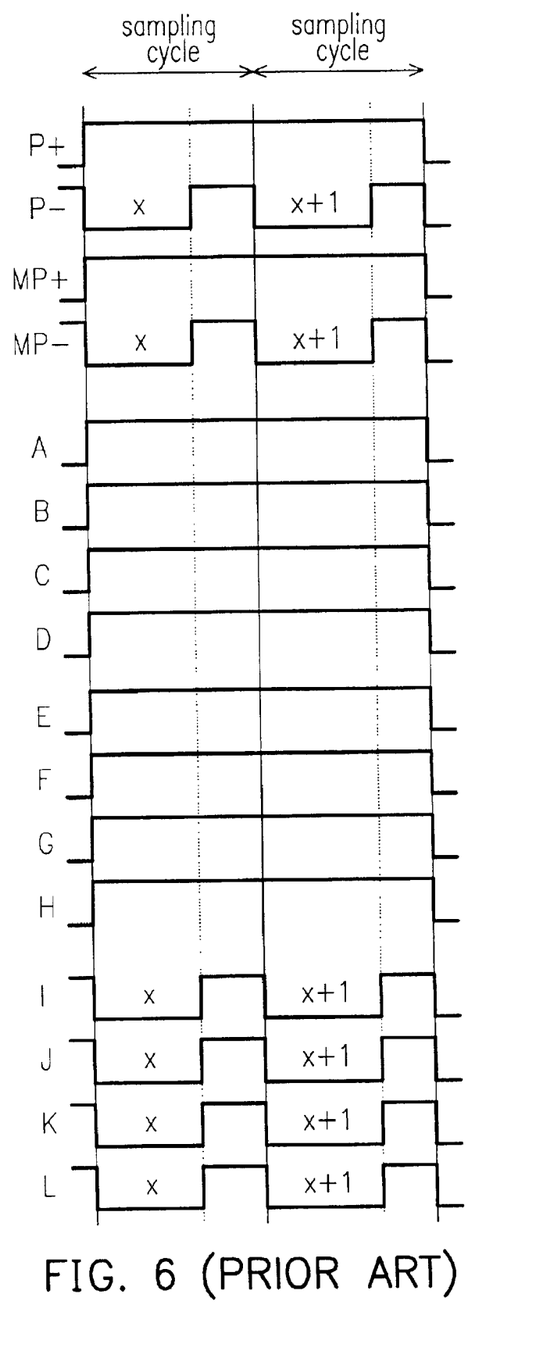
FIG. 6 shows output waveforms according to the conventional PWM DAC.

Referring to FIG. 5, it shows a control device for the MPWM DAC according to the preferred embodiment of the present invention. B1 and B0 are the least significant bits of the PCM signal for enabling the controller 58, 60, 62, and control signals A, B, C and D are used to control status of the output drivers 52a~52d and 54a~54d.

The embodiment described above uses a four-level MPWM DAC as an example. However, this method or structure can be applied to a higher level MPWM DAC, such as $2^n$ levels. For example, if n=1 the resolution increases 1 bit, and if n=2 the resolution then increases two more bits and if n=3 the resolution then increases three bits.

In addition, it should be noticed that the number of the first and the second driver devices can be different. Namely, there are $2^{m1}$ first driver devices and $2^{m2}$ second driver devices, in which m1 and m2 are nature numbers and less than n.

Accordingly, using the MPWM DAC of the present invention not only increases the resolution, but also remain the sampling rate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-level pulse width modulation (MPWM) digital-to-analog converter for receiving a pulse code modulation (PCM) signal having n bits and then outputting a pulse width modulation (PWM) signal, comprising:
   a converter circuit for receiving the PCM signal to convert (n-m) bits of the PCM signal into the PWM signal, wherein m is the number of the least significant bit (LSB) signal of the PCM signal and n>m, and then generating a first input signal, a second input signal and an enabling signal;
   a control device for receiving the enabling signal to generate a control signal;
   a first output driver device having $2^{m1}$ output drivers (m1<n) for receiving the first input signal and the control signal, and then outputting a first driving signal, wherein sum of output currents of the $2^{m1}$ output drivers is equal to a maximum output current of the first output driver device;
   a second output driver device having $2^{m2}$ output drivers (m2<n) for receiving the second input signal and the control signal, and then outputting a second driving signal, wherein sum of output currents of the $2^{m2}$ output drivers is equal to a maximum output current of the second output driver device; and
   an output device for receiving the first and the second driving signals and then outputting the PWM signal;
   wherein in response to the least significant bit (LSB) signal of the PCM signal, the control device selects and disables in a specified interval of each sampling cycle such that the output drivers the first and the second output driver devices are in a high impedance status, to control outputs of the first and the second output driver devices.

2. The MPWM digital-to-analog converter of claim 1, wherein the output drivers of the first output driver device are tri-state buffers.

3. The MPWM digital-to-analog converter of claim 1, wherein the output drivers of the second output driver device are tri-state buffers.

4. The MPWM digital-to-analog converter of claim 1, wherein one of the output drivers of the first output driver device is used as an output buffer.

5. The MPWM digital-to-analog converter of claim 1, wherein one of the output drivers of the second output driver device is used as an output buffer.

6. The MPWM digital-to-analog converter of claim 1, wherein the control device further comprises a plurality of controller for receiving the enabling signal from the converter circuit, the enabling signal is the least significant bit (LSB) of the PCM signal for determining whether the output drivers of the first and the second output driver devices are activated.

7. The MPWM digital-to-analog converter of claim 1, wherein the output device is a speaker.

8. The MPWM digital-to-analog converter of claim 1, wherein the control device further comprises a plurality of controller for receiving the level bit from the converter circuit to determine whether the first and the second output drivers are activated.

9. A multi-level pulse width modulation (MPWM) digital-to-analog converter for receiving a digital signal, wherein the digital signal comprises at least one modulated bit and at least one level bit and then outputs an analog modulated signal, comprising:

a converter circuit for receiving the digital signal and then converting the modulated bit into a first output signal, a second output signal, and the converter circuit outputting the first output signal, the second output signal and the level bit of the digital signal;

a control device for receiving the level bit of the digital signal to generate a control signal;

a plurality of first output drivers for receiving the first input signal and the control signal, and then outputting a first driving signal, wherein sum of output currents of the first output drivers is equal to a maximum output current corresponding to the first driving signal;

a plurality of second output drivers for receiving the second input signal and the control signal, and then outputting a second driving signal, wherein sum of output currents of the first output drivers is equal to a maximum output current corresponding to the first driving signal; and an output device for receiving the first and the second driving signals and then outputting the analog modulated signal.

10. The MPWM digital-to-analog converter of claim 9, wherein in response to the level bit the control device selects and disables in a specified interval of each sampling cycle such that the first and the second output drivers are in a high impedance status, to control outputs of the first and the second output drivers.

11. The MPWM digital-to-analog converter of claim 9, wherein the first output drivers are tri-state buffers.

12. The MPWM digital-to-analog converter of claim 9, wherein the second output drivers are tri-state buffers.

13. The MPWM digital-to-analog converter of claim 9, wherein one of the first output drivers is used as an output buffer.

14. The MPWM digital-to-analog converter of claim 9, wherein one of the second output drivers is used as an output buffer.

15. The MPWM digital-to-analog converter of claim 9, wherein the output device is a speaker.

* * * * *